(12) United States Patent
Nakamura

(10) Patent No.: US 7,457,098 B2
(45) Date of Patent: *Nov. 25, 2008

(54) ELECTROSTATIC CHUCK

(75) Inventor: Tsunehiko Nakamura, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/768,116

(22) Filed: Jun. 25, 2007

(65) Prior Publication Data

US 2007/0247779 A1 Oct. 25, 2007

Related U.S. Application Data

(63) Continuation of application No. 10/766,532, filed on Jan. 28, 2004, now Pat. No. 7,248,456.

(30) Foreign Application Priority Data

Jan. 29, 2003 (JP) ............................. 2003-021200

(51) Int. Cl.
*H01T 23/00* (2006.01)
(52) U.S. Cl. ..................................... 361/234
(58) Field of Classification Search .................. 361/234
See application file for complete search history.

(56) References Cited

U.S. PATENT DOCUMENTS

| | | | |
|---|---|---|---|
| 5,096,536 A | 3/1992 | Cathey, Jr. | 438/715 |
| 5,186,238 A | 2/1993 | Del Puerto et al. | 165/80.4 |
| 5,350,479 A | 9/1994 | Collins et al. | 156/345.53 |
| 5,583,737 A | 12/1996 | Collins et al. | 361/234 |
| 5,761,023 A | 6/1998 | Lue et al. | 361/234 |
| 5,986,874 A * | 11/1999 | Ross et al. | 361/234 |
| 6,108,189 A | 8/2000 | Weldon et al. | 361/234 |
| 6,189,483 B1 | 2/2001 | Ishikawa et al. | 118/723 E |
| 6,556,414 B2 | 4/2003 | Kosakai | 361/234 |
| 6,740,853 B1 * | 5/2004 | Johnson et al. | 219/444.1 |
| 2002/0135968 A1 | 9/2002 | Chen | 361/234 |
| 2004/0212946 A1 | 10/2004 | Kellerman et al. | 361/234 |

FOREIGN PATENT DOCUMENTS

| | | |
|---|---|---|
| JP | 07-018438 | 1/1995 |
| JP | 07-153825 | 6/1995 |
| JP | 07-273176 | 10/1995 |
| JP | 09-213777 | 8/1997 |
| JP | 10-056054 | 2/1998 |

* cited by examiner

*Primary Examiner*—Stephen W Jackson
*Assistant Examiner*—Terrence R Willoughby
(74) *Attorney, Agent, or Firm*—Hogan & Hartson LLP

(57) ABSTRACT

An electrostatic chuck is provided which includes a circular ceramic plate having an electrostatic attractive electrode, a mounting surface for supporting a waferhich is formed on one of the main surfaces of the circular ceramic plate, an annular gas groove formed on the periphery of the mounting surface in the form of concentric circles with a gas inlet communicating with the annular gas groove, and a circular gas recess formed inside the ceramic plate and surrounded by the annular gas groove with a gas inlet communicating with the circular gas recess, wherein the annular gas groove and the circular gas recess are independently separated from each other by an annular rib protrusion, with a plurality of dotted protrusions being formed within both the annular gas groove and the circular gas recess. This arrangement makes it possible to achieve a smaller in-plane temperature difference on the wafer placed on the mounting surface of the electrostatic chuck and a shorter saturating time into a predetermined constant temperature.

11 Claims, 4 Drawing Sheets

ELECTROSTATIC CHUCK

CROSS-REFERENCE TO THE RELATED APPLICATIONS

This is a continuation of application Ser. No. 10/766,532 filed Jan. 28, 2004, the entire contents of which are incorporated by reference. This application also claims benefit of priority under 35 USC 119 to Japanese Patent Application No. 2003-021200 filed Jan. 29, 2003, the entire contents of which are incorporated by reference.

BACKGROUND OF THE INVENTION

1. Field of the Invention

The present invention relates to an electrostatic chuck which is used in an apparatus for manufacturing semiconductor devices or liquid crystal devices and mounts thereon a wafer such as a semiconductor wafer and a liquid crystal glass substrate.

2. Prior Art

Conventionally, in manufacturing processes for semiconductor devices, in order to carry out processes such as film-forming processes and etching processes on wafers such as a silicon wafer with high precision, the wafer is required to be held while properly remaining in high degree of flatness. For such a holding means, electrostatic chucks have been proposed.

The electrostatic chucks can easily fix a wafer thereon with a high degree of wafer flatness which is required for various processes such as film forming or etching processes. The chucks are also applicable even in a vacuum so that they have been widely incorporated in a wide variety of film-forming devices and etching devices.

Here, a further improvement in integration degree of semiconductor elements in semiconductor devices, there have been strong demands for stable performance characteristics, an improvement in production yield, and an increase in the number of wafers which can be processed per unit time. For this reason, it is required that in etching or forming a film, the wafer is heated to a target temperature as quickly as possible to improve the uniform heat distribution on an overall wafer.

Therefore, the mounting surface of the electrostatic chuck for supporting a wafer thereon is provided with grooves or recesses there on and a gas inlet communicating with the grooves or recesses for supplying an inert gas such as He or Ar to the grooves or recesses. As a wafer is chucked onto the mounting surface, a narrow space formed between the lower surface of the wafer and the groove or recesses of the chuck is filled with an inert gas through the gas inlet so that thermal transfer characteristics between the wafer and the mounting surface on the electrostatic chuck are improved, obtaining a uniform heat distribution on a heated wafer.

Moreover, with respect to configuration of grooves or recesses formed in the mounting surface, Japanese Patent No. 2626618 discloses an chuck structure, as shown in FIG. 2, including: a gas inlet 34; a plurality of radial grooves 35 communicating with the gas inlet 34; and multiple annular grooves 36 formed concentrically with virtually equal intervals, centered on the gas inlet 34, which are allowed to communicate with the respective radial grooves 35, with the upper face of the electrostatic chuck 31 other than the radial grooves 35, annular grooves 36 and gas inlet 34 serving as the mounting surface 33 of the wafer W.

Furthermore, as shown in FIGS. 3A and 3B, JP-A-10-56054 discloses a disc-shaped electrostatic chuck 41 having: a gas inlet 44; a plurality of radial grooves 45 communicating with the gas inlet 44; and an annular groove 46 communicates with the ends of the respective radial grooves 45, in which the other upper portions of the electrostatic chuck 41 are prepared as a mounting surface 43 for supporting a wafer W than the radial grooves 45, the annular groove 46 and the gas inlet 44 and the mounting surface 43 is subjected to a blasting process to be formed into a surface with protrusions and recessions, as shown in FIG. 3B.

As shown in FIG. 4, JP-A-7-153825 discloses a chuck structure having: a plurality of fine protrusions 52 dotted on the upper surface of an electrostatic chuck 51 in a disc shape with an annular protrusion 57 formed on the peripheral edge of the upper surface, in which the top faces of the fine protrusions 52 and the annular protrusion 57 serve as a mounting surface 53 for supporting a wafer W with a plurality of gas inlets 54 being formed on the upper surface.

Moreover, JP-A-9-213777 discloses an electrostatic chuck constituted by a combination of annular gas grooves with radial gas grooves, and, as shown in FIG. 5, another electrostatic chuck 61 constituted by a combination of annular gas grooves 66 with circular gas recesses 67.

JP-A-7-18438 discloses an electrostatic chuck is formed with a plurality of annular gas grooves on its surface, and protrusions formed inside a circular gas recess.

Furthermore, as shown in FIG. 6, U.S. Pat. No. 5,761,023 discloses an electrostatic chuck 71 having double annular gas grooves 76; a circular gas recess 77; fine dotted protrusions 78 distributed inside the area of the circular gas recess 77; and an annular rib protrusion 79 located between the double annular gas grooves 76 to be separated into two grooves.

However, in the case of the electrostatic chuck 31 having a mounting face configuration as shown in FIG. 2, with respect to the area of the mounting surface 33 surrounded by the adjacent two radial groups 35 and annular groove 36, the area in the peripheral portion is larger than that in the center portion and therefore the amount of heat transfer from the mounting surface 33 to the wafer W in the peripheral portion is greater than that in the center portion, resulting in wafer temperature at the peripheral portion of the wafer W higher than that at the center portion, with degradation in a uniform heat distribution over the surface of a wafer W.

Moreover, the electrostatic chuck 41 having amounting surface 43 shown in FIGS. 3A and 3B, the mounting surface 43 is a surface including protrusions and recesses among them, which has a small contact area with the wafer; therefore, the low heat quantity to be transmitted from the top face of the fine protrusions to the wafer extends a time required to heat the wafer thereon to a predetermined temperature and the subsequent decreases the number of processed wafers per unit time.

Furthermore, in the electrostatic chuck 51 having the mounting surface 53 shown in FIG. 4, the contact area to the wafer W is as small as 1 to 10% so that the quantity of heat, transmitted from the top faces of the fine protrusions 52 and the annular protrusions 57 to the wafer, is small; therefore, the time required for heating the wafer to a predetermined temperature is taken longer, which does not increase the number of processed wafers per unit time, i.e. wafer process speed.

As shown in FIG. 5, the electrostatic chuck 61, which is constituted by the annular gas groove 66 and the circular gas recess 67, is sucked by the annular protrusion 69 located between the annular gas groove 66 and the circular gas recess 67, with the result that the gas pressure in the gas groove section becomes greater to cause a deformation in the wafer due to the gas pressure, resulting in a failure in sucking the wafer in an even manner and the subsequent temperature difference on the wafer surface.

Further, an electrostatic chuck 71 has been proposed in which gas pressures in two zones, prepared by an annular gas groove 76 and a circular gas recess 77 shown in FIG. 6, are supplied with the gas pressure from the annular gas groove 76 being set greater so that the heat conductivity is made greater to prevent a temperature decrease on the periphery of the wafer W and also to make the wafer temperature distribution uniform. However, since the annular gas groove 76 on the peripheral portion is divided by the annular protrusion 79; therefore, although the temperature difference is made smaller in a direction orthogonal to the annular gas groove 76, the temperature difference is merely made smaller within the span of the width of the annular gas groove 76, with the result that microscopic low temperature portions tend to occur in response to the annular protrusion 79 along the length direction of the gas groove on the periphery of the wafer. Upon manufacturing a recently-developed high density semiconductor element, for example, a semiconductor element having a width of a circuit line of 65 nm, the above-mentioned low temperature portions tend to generate a defective semiconductor element, resulting in a reduction in the yield of the semiconductor elements in the wafer.

SUMMARY OF THE INVENTION

The objective of the present invention is to provide an electrostatic chuck which can achieve a small temperature difference on the surface of a wafer that is heated while being chucked onto the upper surface of the electrostatic chuck.

Therefore, in the present invention, the electrostatic chuck includes a ceramic circular plate and an electrostatic attractive electrode buried therein, with one main surface of the ceramic plate serving as a mounting surface for mounting a wafer thereon. The mounting surface is formed with a circular gas recess formed inside the surface and a concentric annular gas groove formed around the circular gas recession its peripheral edge, and in this arrangement, the annular gas groove and the circular gas recess are separated from each other by an annular protrusion.

A plurality of dotted protrusions is formed inside the annular gas groove and inside the circular gas recess to support the back face of a wafer. In a heating process, the electrostatic chuck of the present invention makes it possible to shorten the time required for reaching a saturated temperature state, and consequently to maintain the in-plane temperature difference in the wafer in a very small level in a normal state.

Here, the diameter of the circular gas recess is preferably set to 70 to 95% of the outer diameter of the mounting surface.

Moreover, a first annular protrusion surrounded between the outer circumference of the circular gas recess and the inner circumference of the annular gas groove preferably has a width W2 in a range from 0.5 to 5 mm, while a second annular protrusion surrounded between the outer circumference of the mounting surface and the outer circumference of the annular gas groove preferably has a width W1 in a range from 1 to 5 mm.

Furthermore, the ratio $S_1/S_2$ of the area $S_1$ of the circular gas recess to the total area $S_2$ of the upper surfaces of the dotted protrusions formed inside the circular gas recess is preferably set in a range of 1 to 5, while the ratio $S_3/S_4$ of the area $S_3$ of the annular gas groove to the total area $S_4$ of the upper surfaces of the dotted protrusions formed inside the annular gas groove is preferably set in a range of 1 to 5.

BRIEF DESCRIPTION OF THE DRAWINGS

The present invention is described in detail with reference to drawings below.

DESCRIPTION OF THE PREFERRED EMBODIMENTS

Figure 1:
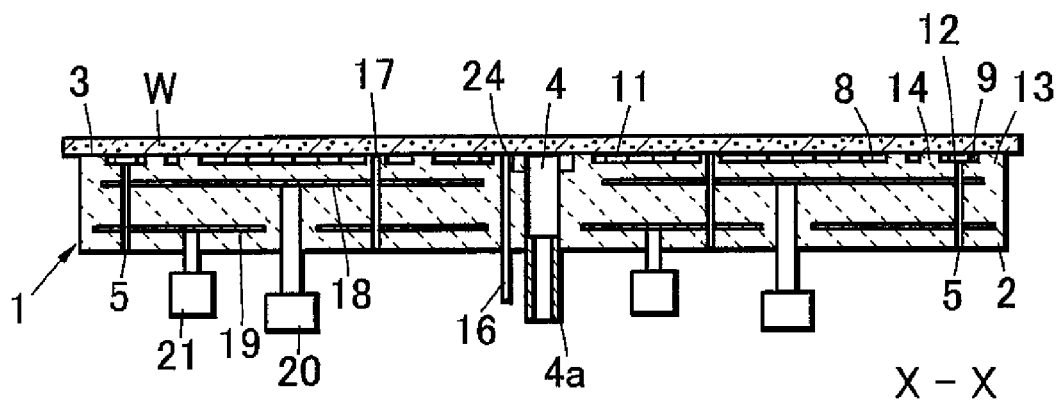
FIGS. 1A and 1B respectively show a cross-sectional view and a plan view showing an electrostatic chuck in accordance with the present invention.
Figure 1:
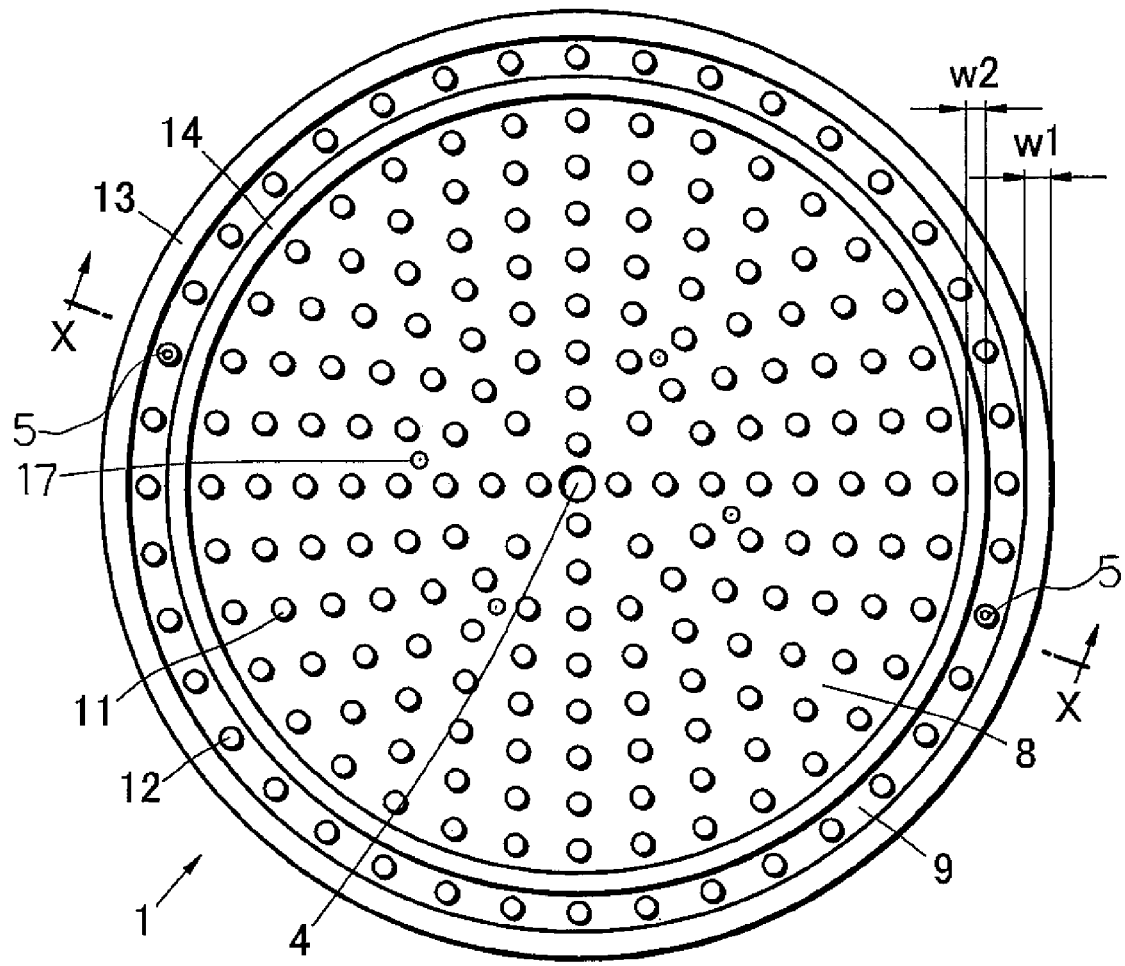

FIG. 1A is a cross-sectional view showing an electrostatic chuck in an embodiment in accordance with the present invention.

This electrostatic chuck 1 includes: a ceramic circular plate 2; a gas inlets 4 and 5 formed on one of main surfaces of the ceramic circular plate 2; a circular gas recess 8 communicating with the gas inlet 4; an annular gas groove 9 communicating with the gas inlet 5; and a plurality of dotted protrusions 11 formed inside the circular gas recess 8; and a plurality of dotted protrusions 12 formed inside the annular gas groove 9, so that a first annular rib protrusion 14 on inside of the annular gas groove 9, a second annular rib protrusion 13 on the outside of the annular gas groove 9, and the dotted protrusions 11 and 13 are disposed for a mounting surface 3 on which a wafer W is placed.

Further, the annular gas groove 9 and the circular gas recess 8 are independent of each other so that gas having mutually different pressures may be introduced into respective gas groove and recess.

The circular ceramic plate has a pair of electrostatic attractive electrodes 18 embedded in the vicinity of one of the major surfaces thereof and a heater electrode 19 embedded in the vicinity of the other major surface; and power-supply terminals 20 and 21 to be electrically connected to the pair of electrostatic attractive electrodes 18 and the heater electrode 19 are respectively joined to the other main surface of the ceramic circular plate 2.

The circular ceramic plate 2 has a temperature measuring element 16 for detecting a temperature in the electrostatic chuck 1.

In use, a wafer W is put on the mounting surface 3, and power is applied across a pair of electrostatic attractive electrodes 18 so that an electrostatic suction force may be exerted between the wafer W and the mounting surface 3 thus, allowing the wafer W to be held and fixed onto the mounting surface 3. Then inert gases such as helium or argon is supplied into the gas inlets 4 and 5 through gas pipes, filling a space formed by the wafer W and the annular gas groove 9 and circular gas recess 8 with the inert gas, resulting in even temperature distribution on the processing surface of the wafer. For example, as a film-forming gas is supplied in this state, a film is deposited on the processing surface on the wafer W, whereas as an etching gas is supplied, the processing surface of the wafer W is subjected to a fine-pattern forming process.

With respect to the detailed configuration of the gas groove and recess, as shown in FIG. 1B, the gas recess 8 is provided with a gas inlet 4 opened in the center of the main surface of the circular ceramic plate 2, with the circular gas recess 8 being placed centered on the gas inlet 4 and the dotted protrusions 11 being disposed within the region of the circular gas recess 8. The annular gas groove 9 is disposed on the periphery of the mounting surface 3, with the dotted protrusions 12 being formed within the region of the annular gas groove 9. Moreover, the gas is sealed, which is supplied between the second annular rib protrusion 13 surrounded by the peripheral portion of the annular gas groove 9 and the outer circumference of the mounting surface 3 and the wafer W. The gas, filled in the annular gas groove 9 and the circular gas recess 8, are sealed from each other by the second annular protrusion 14.

In a state of the wafer W adhered and fixed onto the mounting surface 3 of the electrostatic chuck 1, when inert gas is supplied to the gas inlets 4 and 5, one part of the gas is supplied to a space formed between the circular gas recess 8 radially extending from the gas inlet 4 and the wafer W. The other gas is supplied to spaces formed between the annular gas groove 9 and the wafer W. Thus, inert gas having mutually different pressure can be supplied to the circular gas recess 8 and the annular gas groove 9 from the gas inlets 4 and 5.

Although in general, the periphery of the wafer W put on the mounting surface 3 tends to provide great heat dissipation, to cause a decrease in temperature, with the result that the in plane temperature difference on the wafer W tends to become greater, however, in the present invention, since the electrostatic chuck has the annular gas groove 9 on the periphery of the mounting surface 3, the heat conduction is made greater by increasing a pressure of gas in the peripheral, annular gas groove 9, increasing heat transferred from the upper surface of the electrostatic chuck to the wafer W, and consequently to raise the temperature on the periphery of the wafer. Moreover, a number of the dotted protrusions 12 are distributed within the region of the annular gas groove 9, which efficiently prevents deformation of the wafer.

In the present embodiment, the dotted protrusions 11 are also disposed within the circular gas recess 8, the deformation of the wafer placed on the circular gas recess 8 can be prevented, and the thermal transfer efficiency between the wafer and the mounting surface 3 is increased, heating the wafer uniformly.

The circular gas recess 8 may have a diameter preferably set to 70 to 95% of that diameter of the mounting surface 3, from the viewpoint of preventing a temperature drop on the periphery of the wafer. In the case where the diameter of the circular gas recess 8 is shorter than 70% of the diameter of the mounting surface 3, this state is not preferable since the temperature in the annular portion inside the wafer becomes greater than the temperature on the periphery of the wafer. Moreover, it is not preferable that the diameter of the circular gas recess 8 exceeds 95% of the diameter of the mounting surface 3, since a temperature on the periphery of the wafer tends to decrease, even when the pressure in the annular gas groove 9 is increased, making the thermal transfer efficiency greater. More preferably, the diameter of the circular gas recess 8 may be set to 80 to 90% of the diameter of the mounting surface 3.

Moreover, the width of a first annular rib protrusion 14 surrounded between the outer circumference of the circular gas recess 8 and the inner circumference of the annular gas groove 9 is preferably set to 0.5 to 5 mm, while the width of a second annular rib protrusion 13 surrounded by the outer circumference of the mounting surface 3 and the outer circumference of the gas groove 9 is preferably set to 1 to 5 mm.

In the case where the second annular protrusion 14 has a width less than 0.5 mm, it is difficult to individually adjust the gas pressure difference between the circular gas recess 8 and the annular gas groove 9, resulting in a reduction in the effects of the annular gas groove 9. Moreover, in the case where the width of the second annular protrusion 14 exceeds 5 mm, the temperature of the wafer surface opposing to the protrusion 14 tends to drop, increasing the in-plane temperature difference on the wafer.

Moreover, in the case where the width of the annular protrusion 13 is shorter than 1 mm, the amount of filled gas leak from between the protrusion 13 and the wafer W is increased, and the pressure in a container housing the electrostatic chuck 1 tends to drop, failing to carry out predetermined processes. When the width of the annular protrusion 13 exceeds 5 mm, the temperature on the periphery of the wafer W opposing to the protrusion 13 tends to drop, increasing the temperature difference of the in-plane of the wafer W. Preferably, the width of the annular protrusion 13 is set to 2 to 3 mm.

Moreover, the ratio S1/S2 of the area S1 of the circular gas recess 8 and the total area S2 of the upper surfaces of the protrusions 11 formed inside the circular gas recess 8 is preferably set in a range of 1 to 5, and the ratio S3/S4 of the area S3 of the annular gas groove 9 to the total area S4 of the upper or top surfaces of the dotted protrusions 12 formed inside the annular gas groove 9 is preferably set in a range of 1 to 5.

In the case where the outer diameter of the circular gas recess 8 is set to 70 to 95% of the outer shape of the mounting surface 3 with the respective widths W1 and W2 of the annular protrusions 13 and 14 being set to 1 to 5 mm and 0.5 to 5 mm, respectively, upon chucking the wafer W on to the mounting surface 3, the wafer W tends to be deformed into a convex shape toward the mounting surface 3 side inside the circular gas recess 8, and the in-plane temperature difference in the wafer W tends to become greater; however, it has been found that, when the protrusion 11 is placed inside the circular gas recess 8, the wafer W is supported by the protrusion 11 so that it becomes possible to prevent the wafer W from deforming, and that in the case where the ratio S1/S2 with respect to the upper surface of the protrusions 11 is within 1 to 5, it becomes possible to make the in-plane temperature difference of the wafer W desirably smaller. More preferably, S1/S2 is set in a range from 2 to 4.

Moreover, with respect to the annular gas grooves 9, since the annular gas grooves 9 extend in the circumferential direction with equal intervals, the in-plane temperature difference of the wafer W tends to become greater in the radial direction of the annular gas groove 9 due to influences from the annular protrusion 13 outside and the annular protrusion 14 inside. Here, it has been found that, in order to prevent the in-plane temperature difference from becoming greater, it is preferable to form a plurality of protrusions 12 inside the gas groove 9, and that, when the ratio S3/S4 of the area S3 of the annular gas groove 9 and the total area S4 of the upper surfaces of the dotted protrusions 12 is set in a range from 1 to 5, it becomes possible to make the deformation of the wafer W desirably smaller, and also to make the in-plane temperature difference of the wafer W smaller. More preferably, S3/S4 is set in a range from 2 to 3.

More preferably, a plurality of protrusions 11 are placed inside the circular gas recess 8, with the value of ratio S1/S2 being set to 1 to 5, so that the protrusions 11 are evenly distributed in the circular gas recess 8; thus, the electrostatic force inside the circular recess can be made uniform so that the entire face of the wafer W is fixed with a uniform attractive force and the amount of heat conduction transmitted from the mounting surface 3 to the wafer W is made virtually equal between the center portion and the peripheral portion. Consequently, the temperature difference in the processing surface of the wafer W can be reduced to an extremely small level.

Moreover, with respect to the annular gas grooves 9, the protrusions 12 are preferably arranged evenly in the annular gas groove 9.

Here, the protrusions 11 are preferably distributed evenly over the face surrounding the gas recess 8, and, more specifically, the number thereof is preferably set to 1 to 20 per 4 cm$^2$ within the area S1. In the same manner, with respect to the dotted protrusions 12 in the annular gas grooves 9, the number thereof is preferably set to 1 to 15 per 4 cm$^2$ within the area S3.

Furthermore, with respect to a region R1 in which three or four holes 17 for allowing lift pins to pass therethrough and a temperature-measuring hole 24 for allowing a thermocouple for directly measuring the temperature of the wafer W to pass therethrough are formed, With respect to this region R1 having the holes, the protrusions 11 may be placed irregularly within the region R1 in comparison with the other region R2. It is difficult to make the area thereof virtually the same as the area of the other region R2 since the layout of the grooves is limited. Here, the rate of the region R1 accounting for the entire region is small, and gives only small influences to the temperature distribution of the wafer W. However, in order to make the temperature within the plane of the wafer W uniform, it is necessary to make the areas of the upper surfaces of the protrusions 11 of the region R1 and each of the regions R2 closer to each other.

With respect to the groove width that is a gap between the protrusions 11, it is set to an optimal value in a range of 1 to 5 mm, and the depth thereof is preferably made deeper. With respect to the optimal groove depth, it is preferably set to not less than 50 μm, more preferably, not less than 100 μm; however, when the depth is too great, dielectric breakdown tends to occur on the bottom face of the groove and the electrostatic attractive electrode 18 of the electrostatic chuck 1. Therefore, it is necessary to determine the groove depth so as not to cause dielectric breakdown based upon the film thickness of the insulating layer of the electrostatic chuck 1 and the withstand voltage, the voltage and the like of the material thereof. Moreover, by placing the groove portion at a region having no electrostatic attractive electrode, it is possible to provide an effect in that, upon turning the electrostatic chucking voltage off, the force for holding the wafer W drops in a short time, that is, the residual suction force is reduced.

With respect to the gas inlet 4 placed in the center of the circular gas recess 8, it is preferable to form a plurality of the ports uniformly in the circular gas recess 8; thus, the gas supplied thereto is allowed to flow over the rear face of the wafer W smoothly, making it possible to further reduce the temperature difference within the plane of the wafer W.

Moreover, when the material of the electrostatic chuck 1 is prepared as a material having superior heat conductivity, the effects of the above-mentioned means are of course improved. Preferable materials are aluminum nitride, silicon carbide, boron nitride and the like, which exert heat conductivity of not less than 50 W/(m·K) under the applied temperature.

EXAMPLES

As shown in FIGS. 1A and 1B, the electrostatic chuck of the present invention, which has a circular ceramic plate 1 with a diameter of 300 mm and a thickness of 12 mm, is provided with a circular gas recess 8, an annular gas grooves 9, protrusions 11 and protrusions 12 that are placed on one of its main surfaces. Here, a gas inlet that communicates with the circular gas recess 8 is formed in the center of the circular ceramic plate. Moreover, a metal gas pipe 4a is brazed onto the gas inlet 4. Gas is allowed to flow into the circular gas recess 8 through the gas pipe 4a and the gas inlet 4. Furthermore, a gas inlet 5, which communicates with the annular gas grooves 9, is formed therein. A gas pipe, not shown, is brazed onto the gas inlet 5. Gas is allowed to flow into the annular gas groove 9 from the gas pipe through the gas inlet 5.

A small amount of gas is allowed to flow from an annular protrusion 13 that forms a gas sealing region on the outermost circumference of the mounting surface 3 into a chamber.

Moreover, the gas pressure of the annular gas groove 9 and the gas pressure of the circular gas recess 8 are adjusted separately by the annular protrusion 14.

With respect to the forming method of the circular gas recess 8, the annular gas grooves 9, the protrusions 11 and the protrusions 12, methods, such as a sand blasting process, a machining process and an ultrasonic process, may be used, and the sand blasting process is used from the viewpoints of processing precision, degree of freedom in shape-designing and processing costs. Moreover, the gas inlet 4 in the center is formed by applying a machining process to a sintered material.

In the case of the electrostatic chuck of the present embodiment, the metal pipe, attached to the gas inlet 4, is brazed onto the gas inlet 4; however, this may be fixed by using a bonding agent depending on the application temperature and atmosphere, and in the case of a structure in which the rear surface of the electrostatic chuck is entirely joined to an aluminum base and the like, a gas inlet 4 having virtually the same diameter as the gas inlet 4 of the electrostatic chuck may be preliminary formed in the aluminum base, and after the entire face of this has been joined thereto, a gas pipe 13 may be secured to the gas inlet 4 of the aluminum base with screws or through welding and the like.

The electrostatic chuck to be used in the experimental example, which is an electrostatic chuck utilizing Johnson-Rahbek force, is made of aluminum nitride having a heat conductivity of 50 W/(m·K).

Moreover, those electrostatic chucks having a built-in heater electrode were used so as to confirm the uniform heating property of the wafer. With respect to the temperature distribution of the heater, those having a temperature range within 2° C. on the mounting surface of the wafer of the electrostatic chuck upon heating at a temperature of 200° C. were used.

The groove depths of the circular gas recess 8 and the annular gas groove 9 were formed by using a sand blasting process so as to be set to 100 μm. The actual depth after the process was set in a range from 90 to 110 μm.

Here, the samples thus formed are referred to as samples No. 7 to 12, 21 to 32, and 41 to 52.

Electrostatic chucks, manufactured so as to have gas-groove shapes of FIGS. 2, 4, 5, 6 and 7, for use as comparative samples, are referred to as samples No. 1 to 5. Here, the depth of the gas groove was set to 90 to 100 μm, and with respect to the plate ceramic material, the same materials as those of samples No. 7 to 12 were used.

Each of these electrostatic chucks was set in a vacuum chamber, and a silicon wafer the surface of which was coated with black paint so as to be observed by a thermos-viewer was set thereon. In this state, the pressure thereof was reduced to $10^{-1}$ Pa, and this was heated to 200° C. by using the built-in heater of the electrostatic chuck. The temperature control was carried out by using a thermocouple attached to the vicinity of the center of the rear surface of the electrostatic chuck. In this state, a voltage of 500 V was applied to the electrostatic chuck, with helium gas having a gas pressure of 1300 Pa being supplied through the gas inlet 4 of each of the samples No. 7 and 8. Moreover, helium gas having a gas pressure of 2500 Pa was supplied from the gas inlet 5.

In the same manner, helium gas of 1300 Pa was directed into the gas inlet of each of the samples No. 1 to 5.

With respect to the uniform heating property of the wafer and the property as to how swiftly the wafer is heated to a target temperature, which are subjects to be achieved, evaluation was made on the following items.

With respect to the uniform heating property of the wafer, the temperature distribution on the surface of the wafer was measured by using the thermos-viewer, and the uniform heating property was evaluated based upon a difference between the maximum value and the minimum value derived from the temperature of the entire wafer.

The electrostatic chucks to be used in the experimental examples were allowed to have various shapes by changing the numbers, gaps and groove widths of the radial grooves, annular grooves and partition grooves.

In the examples of the present invention, the wafer was heated by the built-in heater of the electrostatic chuck; however, in the case where the wafer is heated by applying plasma heat and the wafer is then cooled by the electrostatic chuck, the same effects are obtained with only the reversed transmitting direction of heat.

Example 1

First, with respect to the circular gas recess 8 of the electrostatic chuck having an outer shape of the mounting surface 3 of 300 mm, the diameter thereof was varied to 60 to 97% of the outer shape of the mounting surface 3 to prepare respective electrostatic chucks that formed samples No. 6 to 12. Here, the ratio of the area of the protrusion inside the gas groove with respect to the circular gas recess 8 was set to 1. Moreover, the ratio of the area of the protrusion inside the gas groove with respect to the annular gas groove was also set to 1. Samples No. 1 to 5 were prepared for comparative examples. Table 1 shows the results of the tests.

TABLE 1

Figure 2:
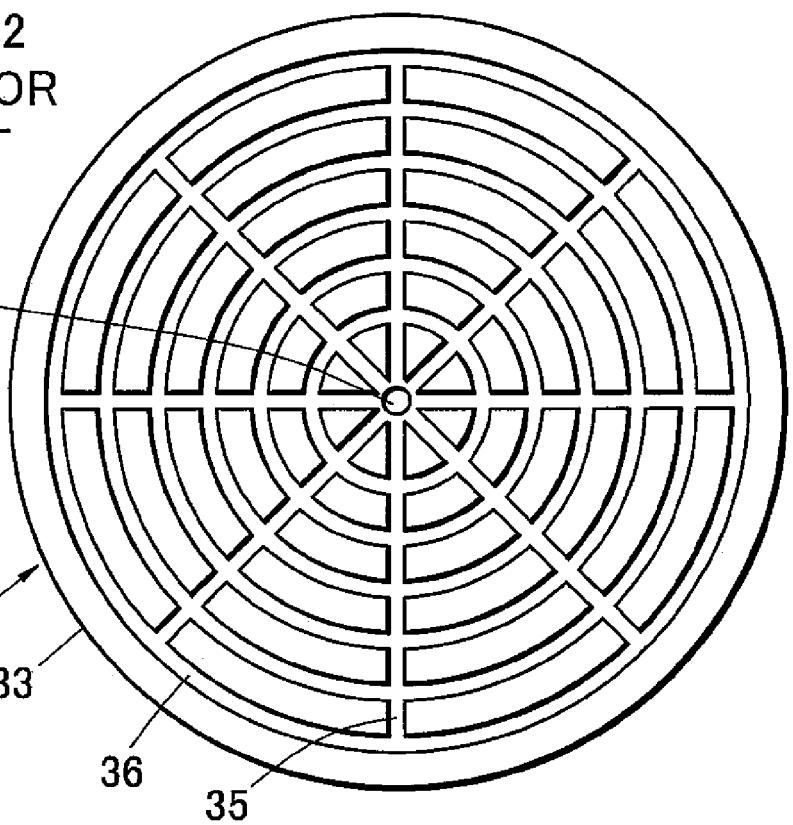
FIG. 2 is a plan view showing the arrangement of a groove on a mounting surface in a conventional electrostatic chuck.
Figure 3:
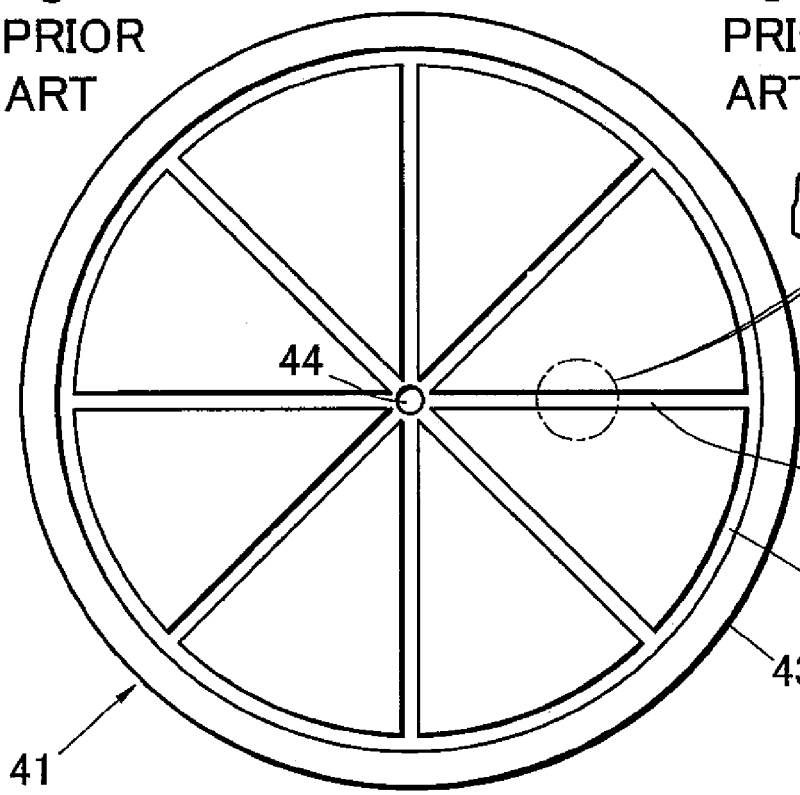
FIG. 3A shows a plan view of a conventional electrostatic chuck.
FIG. 3B is a partial enlarged perspective view of the mounting surface of the electrostatic chuck shown in FIG. 3A.
Figure 3:
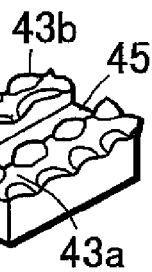
Figure 4:
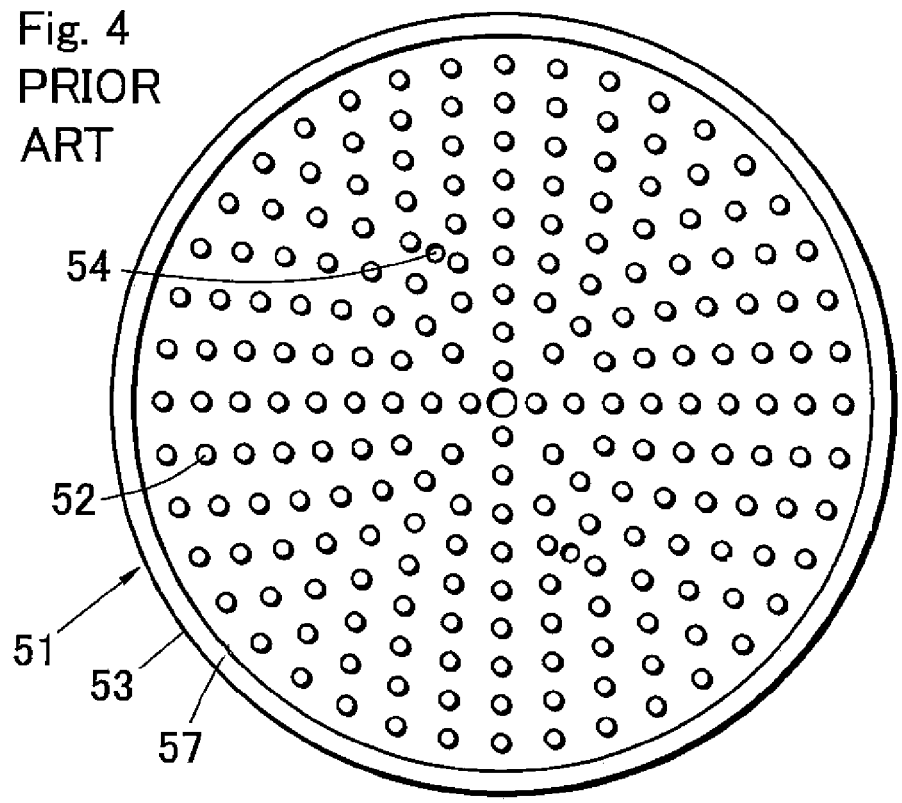
FIG. 4 shows a plan view of the arrangement another groove in a conventional electrostatic chuck.
Figure 5:
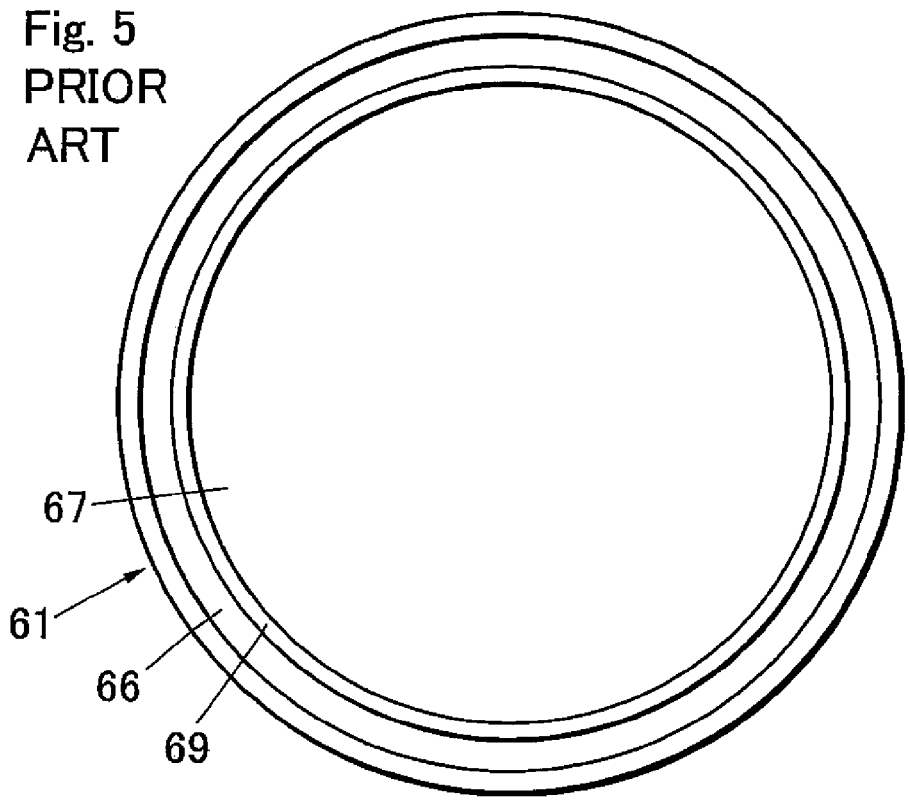
FIG. 5 is a plan view showing the arrangement of still another groove in a conventional electrostatic chuck.
Figure 6:
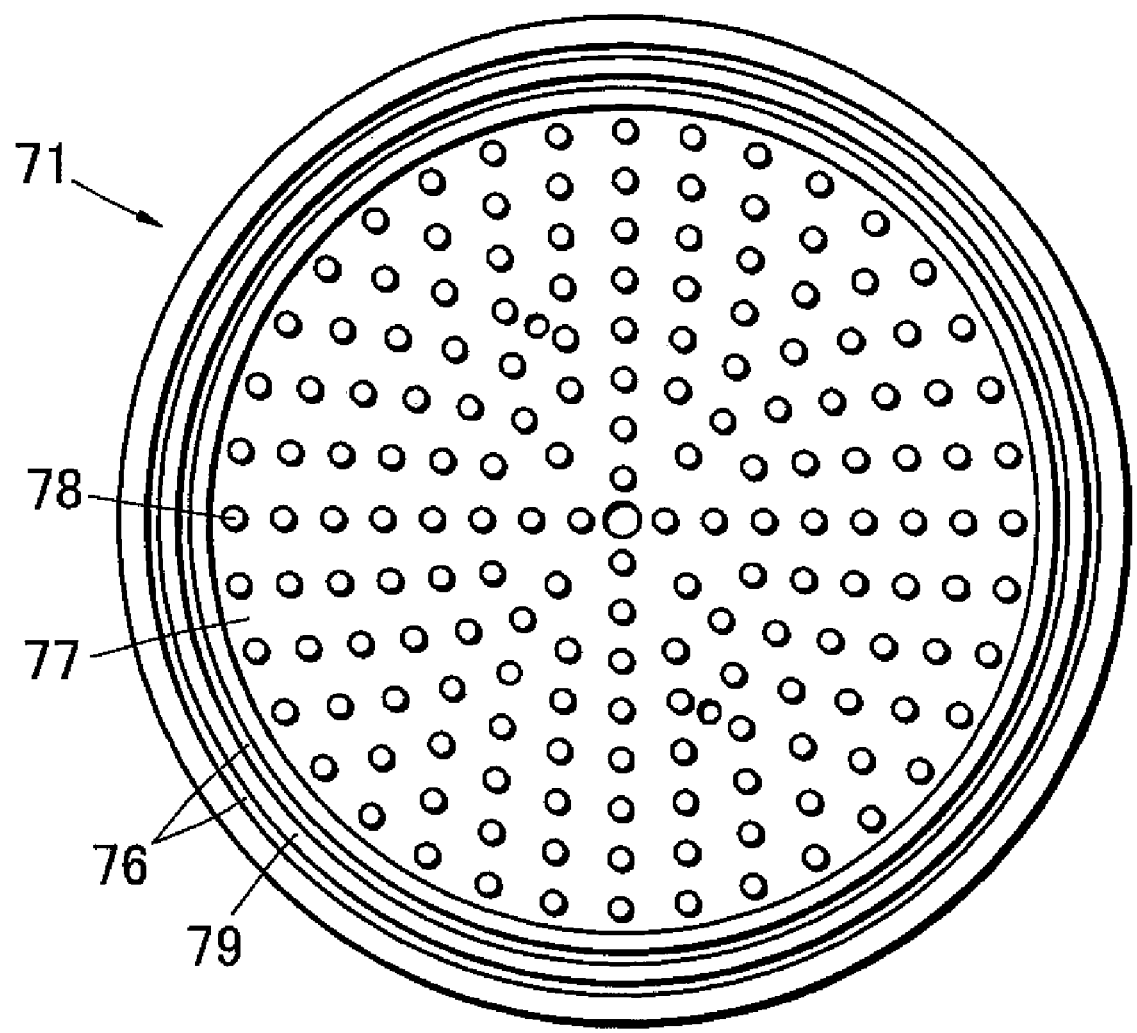
FIG. 6 is a plan view showing the arrangement of another groove in a conventional electrostatic chuck.

| | sample | | | | | | | | | | |
|---|---|---|---|---|---|---|---|---|---|---|---|
| | 1 | 2 | 3 | 4 | 5 | 7 | 8 | 9 | 10 | 11 | 12 |
| shape of mounting surface | FIG. 2 | FIG. 3 | FIG. 4 | FIG. 5 | FIG. 6 | FIG. 1 | FIG. 1 | FIG. 1 | FIG. 1 | FIG. 1 | FIG. 1 |
| Dc/D (%) | — | — | — | — | — | 60 | 70 | 80 | 90 | 95 | 97 |
| wafer temp. (° C.) | 6 | 6 | 6 | 5 | 5 | 2.5 | 2.0 | 2 | 2 | 2.5 | 3 |
| time to saturate temp. (s) | 15 | 16 | 14 | 15 | 13 | 9 | 7 | 6 | 6 | 7 | 8 |

In order to evaluate the property as to how swiftly the wafer is heated to a target temperature, since helium gas was introduced to the rear face of the wafer after the wafer had been adhered thereto by the electrostatic chuck, the time required for the wafer to reach a saturated temperature at which the average temperature of the wafer came to have a temperature changing rate of 0.1° C./sec was measured. This is because in order to properly control the temperature of the wafer, amounts of heat conduction in the wafer and the electrostatic chuck form important factors.

The above-mentioned difference in the in-plane temperatures of the wafer is given as a difference between the maximum value and the minimum value of the temperature of the entire wafer that are measured by the thermos-viewer, with the setting temperature of the electrostatic chuck being determined at 200° C. The average temperature of the wafer was given as an average value of measured temperatures at total nine positions, that is, the center point of the wafer, four positions that are arranged with the same interval at 10 mm from the outer circumference of the wafer and four positions located at middle points between the center and the outer circumference of the wafer. When the time required for the wafer to reach the saturated temperature is long, there is a delay in the processing start time, causing a longer processing time per one wafer. This case causes a decrease in the number of the processed wafers W per unit time, and is not preferable.

It was found that the electrostatic chucks of the present invention corresponding to samples No. 7 to 12 had in-plane temperature differences of the wafer within 3° C., which were preferably reduced values.

Moreover, in the case of the respective samples No. 8 to 11 in which the diameter of the circular gas recess was varied to 70 to 95% of the outer shape of the mounting surface, the temperature difference on the wafer surface was as small as not more than 2.5° C., with the time required to reach the saturated temperature which was also as small as not more than 7 seconds; thus, these samples were found to be desirable.

Furthermore, in the case of the respective samples No. 9 to 10 in which the diameter of the circular gas recess was varied to 80 to 90% of the outer shape of the mounting surface, the temperature difference on the wafer surface was as small as not more than 2.0° C., with the time required to reach the saturated temperature which was also as small as not more than 6 seconds; thus, these samples were found to be desirable.

Example 2

Next, the same manufacturing processes as example 1 were carried out to prepare electrostatic chucks with the width W2 of the annular protrusion 14 surrounded by the outer circumference of the circular gas recess 8 and the inner circumference of the annular gas groove 9 and the width W1 of the annular protrusion 13 surrounded by the outer circumference of the mounting surface and the outer circumference of the annular gas groove being respectively set within a range from 0.2 to 7 mm; and the in-plane temperature difference of the wafer was measured.

No. 21 to 32 of Table 2 show the results.

TABLE 2

| | sample | | | | | | | | | | | |
|---|---|---|---|---|---|---|---|---|---|---|---|---|
| | 21 | 22 | 23 | 24 | 25 | 26 | 27 | 28 | 29 | 30 | 31 | 32 |
| shape of mounting surface | FIG. 1 | | | | | | | | | | | |
| width (mm) of first protrusion | 0.2 | 1 | 1 | 3 | 5 | 7 | 3 | 3 | 3 | 3 | 3 | 3 |
| width (mm) of second protrusion | 3 | 4 | 3 | 3 | 3 | 3 | 0.3 | 0.5 | 2 | 3 | 5 | 7 |
| wafer temp. (° C.) | 3 | 2 | 1.5 | 1.5 | 2 | 3 | 3 | 2 | 1.5 | 1.5 | 2 | 3 |
| time to saturate temp. (s) | 9 | 6 | 5 | 5 | 5 | 9 | 8 | 5 | 4 | 4 | 5 | 9 |

With respect to the samples Nos. 22 to 25 as well as 28 to 31, the widths of the annular protrusions 13 and 14 were respectively in ranges of 1 to 5 mm and 0.5 to 5 mm, and an in-plane temperature difference of the wafer was not more than 2° C., with the saturation time being not more than 6 seconds; thus, these samples were found to be desirable.

In the case of sample No. 21 that was out of the range of the present invention, the width of the annular protrusion 13 was as small as 0.2 mm with a greater amount of gas leak, and an in-plane temperature difference of the wafer was 3° C., which is slightly great. In contrast, in the case of sample No. 26, the width of the annular protrusion 13 was as great as 7 mm, with an in-plane temperature difference of the wafer being as great as 3° C.

Moreover, in the case of sample No. 27, the width of the annular protrusion 13 was as small as 0.5 mm with a greater amount of gas leak, and an in-plane temperature difference of the wafer was 3° C., which is slightly great. In contrast, in the case of sample No. 32, the width of the annular protrusion 13 was as great as 7 mm, and an in-plane temperature difference of the wafer was as great as 3° C.

Consequently, it has been found that when the width of the annular protrusion 14 is preferably set in a range from 0.5 to 5 mm, with the width of the annular protrusion 13 being preferably set in a range from 1 to 5 mm; thus, it is possible to obtain superior characteristics.

Moreover, as indicated by samples Nos. 23, 24, 29 and 30, when the width of the annular protrusion 14 is set in a range from 1.0 to 3 mm, with the width of the annular protrusion 14 being set in a range from 2 to 3 mm, an in-plane temperature difference of the wafer is as small as not more than 1.5° C., with the time required to reach the saturated temperature being set to not more than 5 seconds; thus, it becomes possible to obtain superior properties.

Example 3

Next, the same manufacturing processes as example 1 were carried out to prepare electrostatic chucks with the area S1 of the circular gas recess 8 and the total area S2 of the upper surfaces of the dotted protrusions 11 located inside the circular gas recess as well as the area S3 of the annular gas groove 9 and the area S4 of the upper surfaces of the protrusions 12 located inside thereof being respectively varied; thus, electrostatic chucks having varied ratios of S1/S2 and S3/S4 were manufactured, and the characteristics thereof were evaluated in the same manner as Example 1. The results of Sample Nos. 41 to 52 are shown in Table 3.

TABLE 3

| | sample | | | | | | | | | | | |
|---|---|---|---|---|---|---|---|---|---|---|---|---|
| | 41 | 42 | 43 | 44 | 45 | 46 | 47 | 48 | 49 | 50 | 51 | 52 |
| shape of mounting surface | FIG. 1 | | | | | | | | | | | |
| S1/S2 | 0.5 | 1 | 2 | 4 | 5 | 6 | 3 | 3 | 3 | 3 | 3 | 3 |
| S3/S4 | 3 | 3 | 3 | 3 | 3 | 3 | 0.5 | 1 | 2 | 3 | 5 | 7 |
| wafer temp. (° C.) | 2 | 1.5 | 0.8 | 0.8 | 1.2 | 2 | 2 | 1.4 | 0.7 | 0.8 | 1.5 | 2 |
| time to saturate temp. (s) | 6 | 4 | 4 | 3 | 4 | 6 | 7 | 4 | 3 | 3 | 4 | 6 |

With respect to samples Nos. 42 to 45 as well as 48 to 51, the value of S1/S2 is in a range from 1 to 5, the value of S3/S4 is in a range of 1 to 5, an in-plane temperature difference of the wafer is not more than 1.5° C. and the saturation time is also as small as not more than 4 seconds; thus, these samples are found to be preferable.

In the case of sample No. 41, which is out of the range of the present invention, the value of S1/S2 is as small as 0.5, and the in-plane temperature difference of the wafer is 2° C., which is comparatively great. In contrast, in the case of sample No. 46, the value of S1/S2 is as great as 6 and an in-plane temperature difference of the wafer is not more than 2° C., which is comparatively great.

Moreover, in the case of sample No. 47 which is out of the range of the present invention, the value of S3/S4 is 0.5, which is too small, with the result that the in-plane temperature difference of the wafer is as great as 2° C. Furthermore, in the case of sample No. 52, the value of S3/S4 is as great as 7, with the result that the in-plane temperature difference of the wafer is as great as 2° C.

Therefore, it has been found that the value of S1/S2 and the value of S3/S4 are preferably set in a range from 1 to 5 so as to provide superior characteristics.

What is claimed is:

1. An electrostatic chuck comprising:
    a circular ceramic plate having an electrostatic attractive electrode;
    a mounting surface for supporting a wafer formed on one of the main surfaces of the circular ceramic plate;
    an annular gas groove formed on the periphery of the mounting surface in the form of concentric circles and a first gas inlet which communicates with the annular gas groove; and
    a circular gas recess formed inside the circular ceramic plate, and a second gas inlet which communicates with the circular gas recess,
    wherein the annular gas groove and the circular gas recess are independently separated from each other by a first annular rib protrusion,
    wherein a plurality of dotted protrusions are disposed within both the annular gas groove and the circular gas recess, wherein the circular gas recess has a diameter which is set to 70 to 95% of the outer diameter of the mounting surface,
wherein the first annular rib protrusion surrounded by the outer circumference of the circular gas recess and the inner circumference of the annular gas groove has a width in a range of 0.5 to 5 mm, and a second annular rib protrusion surrounded by the outer circumference of the mounting surface and the outer circumference of the annular gas groove has a width in a range of 1 to 5 mm,
wherein the number of the dotted protrusions within the circular gas recess is set to 1 to 20 per 4 $cm^2$, and the number of the dotted protrusions within the annular gas groove is set to 1 to 15 per 4 $cm^2$,
wherein the annular gas groove is placed at a region having no electrostatic attractive electrode.

2. The electrostatic chuck according to claim 1 wherein the circular ceramic plate has a heating element for heating the wafer buried in the ceramic plate or attached to the other main surface of the ceramic plate.

3. The electrostatic chuck according to claim 1, wherein the circular ceramic plate comprises at least one from the group consisting of aluminum nitride, silicon carbide and boron nitride which have heat conductivity of not less than 50 W/(m-K).

4. The electrostatic chuck according to claim 2, wherein the circular ceramic plate comprises at least one from the group consisting of aluminum nitride, silicon carbide and boron nitride which have heat conductivity of not less than 50 W/(m-K).

5. The electrostatic chuck according to claim 1, wherein the diameter of the circular gas recess is set to 80 to 90% of the diameter of the mounting surface.

6. The electrostatic chuck according to claim 1, wherein the first annular rib protrusion surrounded by the outer circumference of the circular gas recess and the inner circumference of the annular gas groove has a width in a range of 0.5 to 5 mm, and an second annular rib protrusion surrounded by the outer circumference of the mounting surface and the outer circumference of the annular gas groove has a width in a range of 2 to 3 mm.

7. The electrostatic chuck according to claim 1, wherein the ratio S1/S2 of the area S1 of the circular gas recess to a total area S2 of the upper surfaces of the dotted protrusions disposed inside the circular gas recess is set in a range of 2 to 4; and the ratio S3/S4 of an area S3 of the annular gas groove to a total area S4 of the upper surfaces of the dotted protrusions formed inside the annular gas groove is set in a range of 2 to 3.

8. An electrostatic chuck comprising:
a circular ceramic plate having an electrostatic attractive electrode;
a mounting surface for supporting a wafer formed on one of the main surfaces of the circular ceramic plate;
an annular gas groove formed on the periphery of the mounting surface in the form of concentric circles and a gas inlet which communicates with the annular gas groove; and
a circular gas recess formed inside the circular ceramic plate, and a gas inlet which communicates with the circular gas recess,
wherein the annular gas groove and the circular gas recess are independently separated from each other by a first annular rib protrusion,
wherein a plurality of dotted protrusions are disposed within both the annular gas groove and the circular gas recess,
wherein the circular gas recess has a diameter which is set to 80 to 90% of the outer diameter of the mounting surface,
wherein the first annular rib protrusion surrounded by the outer circumference of the circular gas recess and the inner circumference of the annular gas groove has a width in a range of 0.5 to 5 mm, and an second annular rib protrusion surrounded by the outer circumference of the mounting surface and the outer circumference of the annular gas groove has a width in a range of 2 to 3 mm,
wherein the number of the dotted protrusions within the circular gas recess is set to 1 to 20 per 4 $cm^2$, and the number of the dotted protrusions within the annular gas groove is set to 1 to 15 per 4 $cm^2$,
wherein the annular gas groove is placed at a region having no electrostatic attractive electrode.

9. The electrostatic chuck according to claim 5, wherein the circular ceramic plate has a heating element for heating the wafer buried in the ceramic plate or attached to the other main surface of the ceramic plate.

10. The electrostatic chuck according to claim 5, wherein the circular ceramic plate comprises at least one from the group consisting of aluminum nitride, silicon carbide and boron nitride which have heat conductivity of not less than 50W/(m-K).

11. The electrostatic chuck according to claim 9, wherein the circular ceramic plate comprises at least one from the group consisting of aluminum nitride, silicon carbide and boron nitride which have heat conductivity of not less than 50W/(m-K).

* * * * *